United States Patent
Kim et al.

(10) Patent No.: US 11,776,826 B2
(45) Date of Patent: Oct. 3, 2023

(54) APPARATUS AND METHOD FOR TREATING SUBSTRATE

(71) Applicant: SEMES CO., LTD., Chungcheongnam-do (KR)

(72) Inventors: Junho Kim, Gyeonggi-do (KR); Kyungsik Shin, Chungcheongnam-do (KR); Youngseo An, Gyeonggi-do (KR); Jinki Shin, Busan (KR); Man Kyu Kang, Chungcheongnam-do (KR); Yoonki Sa, Seoul (KR)

(73) Assignee: SEMES CO., LTD., Chungcheongnam-Do (KR)

( * ) Notice: Subject to any disclaimer, the term of this patent is extended or adjusted under 35 U.S.C. 154(b) by 147 days.

(21) Appl. No.: 16/999,836

(22) Filed: Aug. 21, 2020

(65) Prior Publication Data

US 2021/0057239 A1 Feb. 25, 2021

(30) Foreign Application Priority Data

Aug. 23, 2019 (KR) .................. 10-2019-0103785

(51) Int. Cl.
*H01L 21/67* (2006.01)
*H01L 21/683* (2006.01)

(52) U.S. Cl.
CPC .. *H01L 21/67109* (2013.01); *H01L 21/67017* (2013.01); *H01L 21/67161* (2013.01); *H01L 21/683* (2013.01)

(58) Field of Classification Search
CPC ......... H01L 21/67109; H01L 21/67017; H01L 21/67161; H01L 21/683
See application file for complete search history.

(56) References Cited

U.S. PATENT DOCUMENTS 5,817,156 A * 10/1998 Tateyama .......... H01L 21/68778
118/725
2002/0132052 A1 * 9/2002 Kumar .............. H01L 21/02205
118/724

(Continued)

FOREIGN PATENT DOCUMENTS

JP          9148422 A    6/1997
JP       2001237157 A    8/2001

(Continued)

OTHER PUBLICATIONS

Engineering360 by IEEE GlobalSpec, "Wafer Chucks Information", archived by Internet Archive on Nov. 16, 2017, available at http://web.archive.org/web/20171126202943/https://www.globalspec.com/learnmore/manufacturing_process_equipment/microelectronics_manufacturing/wafer_chucks, 3 pages (Year: 2017).*

(Continued)

*Primary Examiner* — Parviz Hassanzadeh
*Assistant Examiner* — Margaret Klunk
(74) *Attorney, Agent, or Firm* — Procopio, Cory, Hargreaves & Savitch LLP

(57) ABSTRACT

An apparatus for treating a substrate includes a process chamber having a process space therein, a support unit that supports the substrate in the process space, a heating member that heats the substrate supported on the support unit, and an exhaust unit that evacuates the process space. The exhaust unit includes an exhaust duct and a heat retention unit having a retention space that retains heat released from the process space. The retention space surrounds an adjacent area located adjacent to the process chamber in the exhaust duct.

11 Claims, 10 Drawing Sheets

(56) References Cited

U.S. PATENT DOCUMENTS

| | | | | |
|---|---|---|---|---|
| 2007/0169373 A1* | 7/2007 | Aoki | ................. | H01L 21/67748 |
| | | | | 34/443 |
| 2009/0111285 A1* | 4/2009 | Yamazaki | ......... | H01L 21/67109 |
| | | | | 257/E21.328 |
| 2014/0377039 A1* | 12/2014 | Yang | ................. | H01L 21/67109 |
| | | | | 414/806 |
| 2017/0032983 A1* | 2/2017 | Muta | ................. | H01L 21/67109 |
| 2019/0096716 A1* | 3/2019 | Iwasaka | ............ | H01L 21/68742 |

FOREIGN PATENT DOCUMENTS

| | | | |
|---|---|---|---|
| KR | 100181908 B1 | | 4/1999 |
| KR | 10-2007-0078073 A | | 7/2007 |
| KR | 10-2009-0059903 A | | 6/2009 |
| KR | 2009059903 A | * | 6/2009 |
| KR | 10-1685833 B1 | | 12/2016 |
| KR | 1020170015210 A | | 2/2017 |
| KR | 10-1802167 B1 | | 12/2017 |
| KR | 10-1922758 B1 | | 2/2019 |
| KR | 10-2019-0034091 A | | 4/2019 |

OTHER PUBLICATIONS

Definition of "chuck" from Dictionary.com, available at https://www.dictionary.com/browse/chuck as accessed on Jan. 14, 2023, 3 pages. (Year: 2023).*

* cited by examiner

APPARATUS AND METHOD FOR TREATING SUBSTRATE

CROSS-REFERENCE TO RELATED APPLICATIONS

A claim for priority under 35 U.S.C. § 119 is made to Korean Patent Application No. 10-2019-0103785 filed on Aug. 23, 2019, in the Korean Intellectual Property Office, the entire contents of which are hereby incorporated by reference.

BACKGROUND

Embodiments of the inventive concept described herein relate to an apparatus and method for treating a substrate.

Various processes, such as cleaning, deposition, coating, photolithography, etching, ion implantation, and the like, are performed to manufacture semiconductor elements. Among these processes, the deposition process and the coating process are used to form a film on a substrate. In general, a deposition process is a process of forming a film by depositing a process gas on a substrate, and a coating process is a process of forming a liquid film by applying a treatment liquid to a substrate.

A bake process is performed on a substrate before and after a film is formed on the substrate. The bake process is a process of heating the substrate to a process temperature or more in a sealed space such as a bake chamber. In the bake process, the entire area of the substrate is uniformly heated, or temperatures of respective areas of the substrate are adjusted by an operator.

Fumes generated in the bake process are released through an exhaust duct that is connected to the bake chamber to release an atmosphere in the bake chamber. While the fumes flow through the exhaust duct, the fumes are deposited on the inner wall of the exhaust duct. In particular, the quantity by which the fumes are deposited is significantly increased in an area adjacent to a point where the exhaust duct is connected with the bake chamber.

Due to the fumes deposited on the exhaust duct, exhaust pressure is not maintained at a set pressure, which causes a poor process. Various methods are used to prevent the fumes from being deposited on the exhaust duct. However, these methods are ineffective in preventing the deposition of the fumes, or a lot of thermal energy is separately consumed.

SUMMARY

Embodiments of the inventive concept provide an apparatus and method for maintaining an exhaust duct at high temperature.

Embodiments of the inventive concept provide an apparatus and method for preventing deposition of fumes on an exhaust duct.

The technical problems to be solved by the inventive concept are not limited to the aforementioned problems, and any other technical problems not mentioned herein will be clearly understood from the following description by those skilled in the art to which the inventive concept pertains.

According to an exemplary embodiment, an apparatus for treating a substrate includes a process chamber having a process space therein, a support unit that supports the substrate in the process space, a heating member that heats the substrate supported on the support unit, and an exhaust unit that evacuates the process space. The exhaust unit includes an exhaust duct and a heat retention unit having a retention space that retains heat released from the process space. The retention space surrounds an adjacent area located adjacent to the process chamber in the exhaust duct.

According to an embodiment, the heat retention unit may include a housing that is formed of a heat insulating material and that has the retention space therein.

According to an embodiment, the exhaust duct may be coupled to an upper wall of the process chamber, the housing may be attached to the upper wall of the process chamber, and the adjacent area may be an area to which the upper wall of the process chamber and the exhaust duct are adjacent.

According to an embodiment, the housing may include an upper wall and a ring-shaped sidewall extending downward from the upper wall, and the sidewall may be directly coupled to the process chamber.

According to an embodiment, when viewed from above, the housing may have a size corresponding to the process chamber.

According to an embodiment, the heat retention unit may further include a shape-retaining member that maintains a shape of an upper wall of the housing.

According to an embodiment, the shape-retaining member may include a reinforcing plate coupled to a bottom surface of the upper wall to form an interior space between the upper wall and the shape-retaining member.

According to an embodiment, the reinforcing plate may have radially extending grooves formed on a bottom surface thereof.

According to an embodiment, the interior space may be filled with gas.

According to an embodiment, the interior space may be provided in a state in which a flow of the gas to the outside is interrupted.

According to an embodiment, the gas may be air.

According to an embodiment, the heat retention unit may further include a cover that surrounds the exhaust duct in the adjacent area.

According to an embodiment, the apparatus may further include a gas plate disposed in the process space to face the substrate supported on the support unit and a shielding plate disposed on a top side of the gas plate, and the exhaust duct may include a first duct coupled to the gas plate and a second duct coupled to the shielding plate.

According to an embodiment, the gas plate may have holes through which gas is supplied to generate a downward gas flow in the process space.

According to an embodiment, the treatment of the substrate may be a bake process.

According to an exemplary embodiment, a method for treating a substrate includes disposing the substrate in a process space and treating the substrate by heating the substrate in the process space. An atmosphere in the process space is released through an exhaust duct while the substrate is treated. A retention space that retains heat released from the process space and an interior space that forms a sealed space in the retention space are provided outside the process space. The exhaust duct is provided to pass through the retention space, and a region of the exhaust duct passing through the retention space is heated by heat retained in the retention space and the interior space.

According to an embodiment, the retention space may be provided by a housing formed of a heat insulating material.

According to an embodiment, the interior space may be filled with gas.

According to an embodiment, the exhaust duct may be surrounded by a cover.

According to an embodiment, the treatment of the substrate may be a bake process of performing heat treatment on the substrate.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Figure 1:
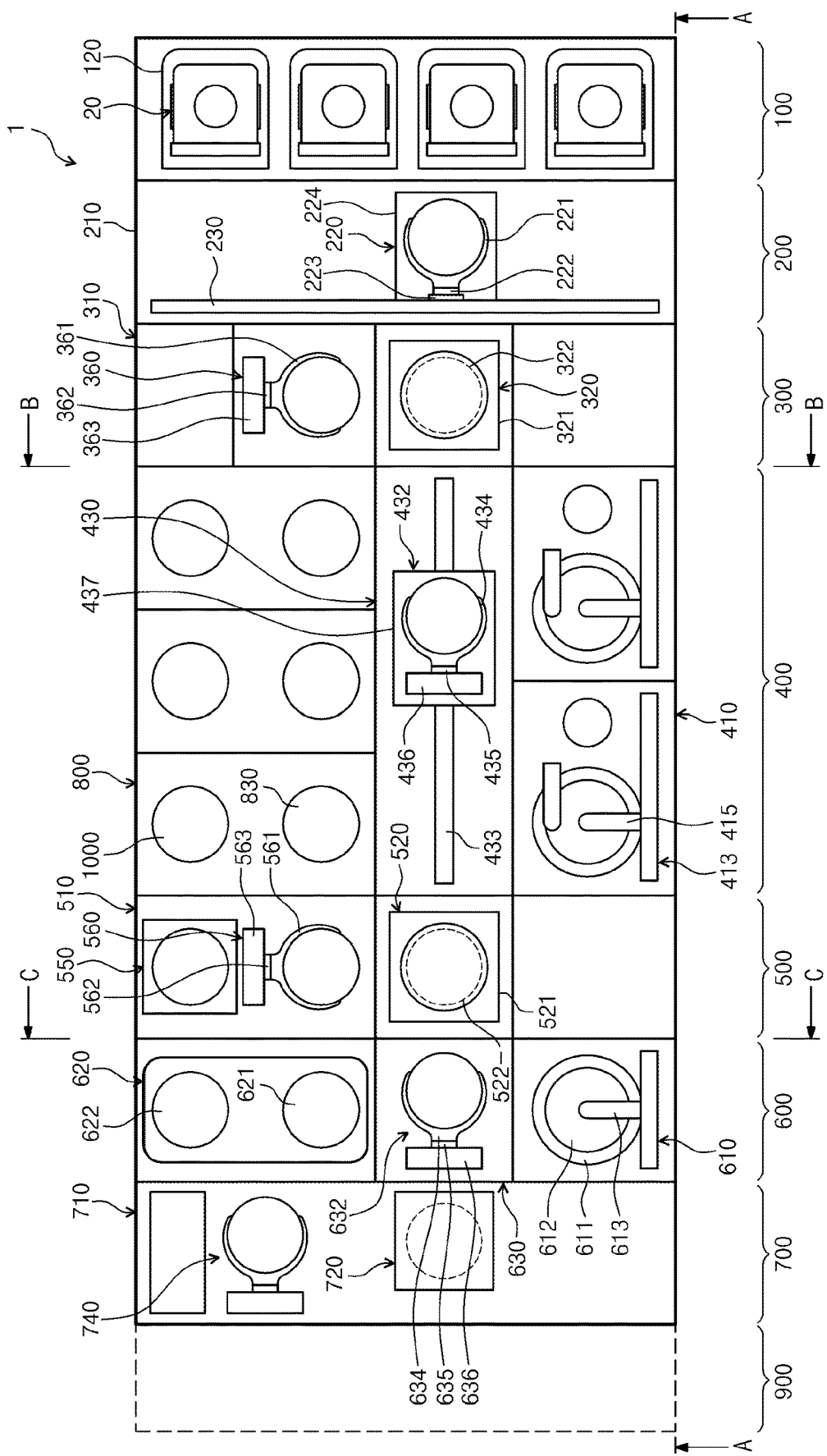
FIG. 1 is a plan view illustrating substrate treating equipment according to an embodiment of the inventive concept.

Hereinafter, embodiments of the inventive concept will be described in more detail with reference to the accompanying drawings. Various modifications and variations can be made to the embodiments of the inventive concept, and the scope of the inventive concept should not be construed as limited to the embodiments set forth herein. These embodiments are provided so that the inventive concept will be thorough and complete, and will fully convey the scope of the inventive concept to those skilled in the art. Accordingly, in the drawings, the shapes of components are exaggerated for clarity of illustration.

Substrate treating equipment of the inventive concept may be used to perform a photolithography process on a substrate such as a semiconductor wafer or a flat display panel. In particular, the substrate treating equipment of the inventive concept may be connected to a stepper and may be used to perform a coating process and a developing process on a substrate. However, the inventive concept is applicable to various apparatuses in which a gas flow is formed in a sealed space in which a substrate is treated. In the following description, it will be exemplified that a circular wafer is used as a substrate.

Figure 2:
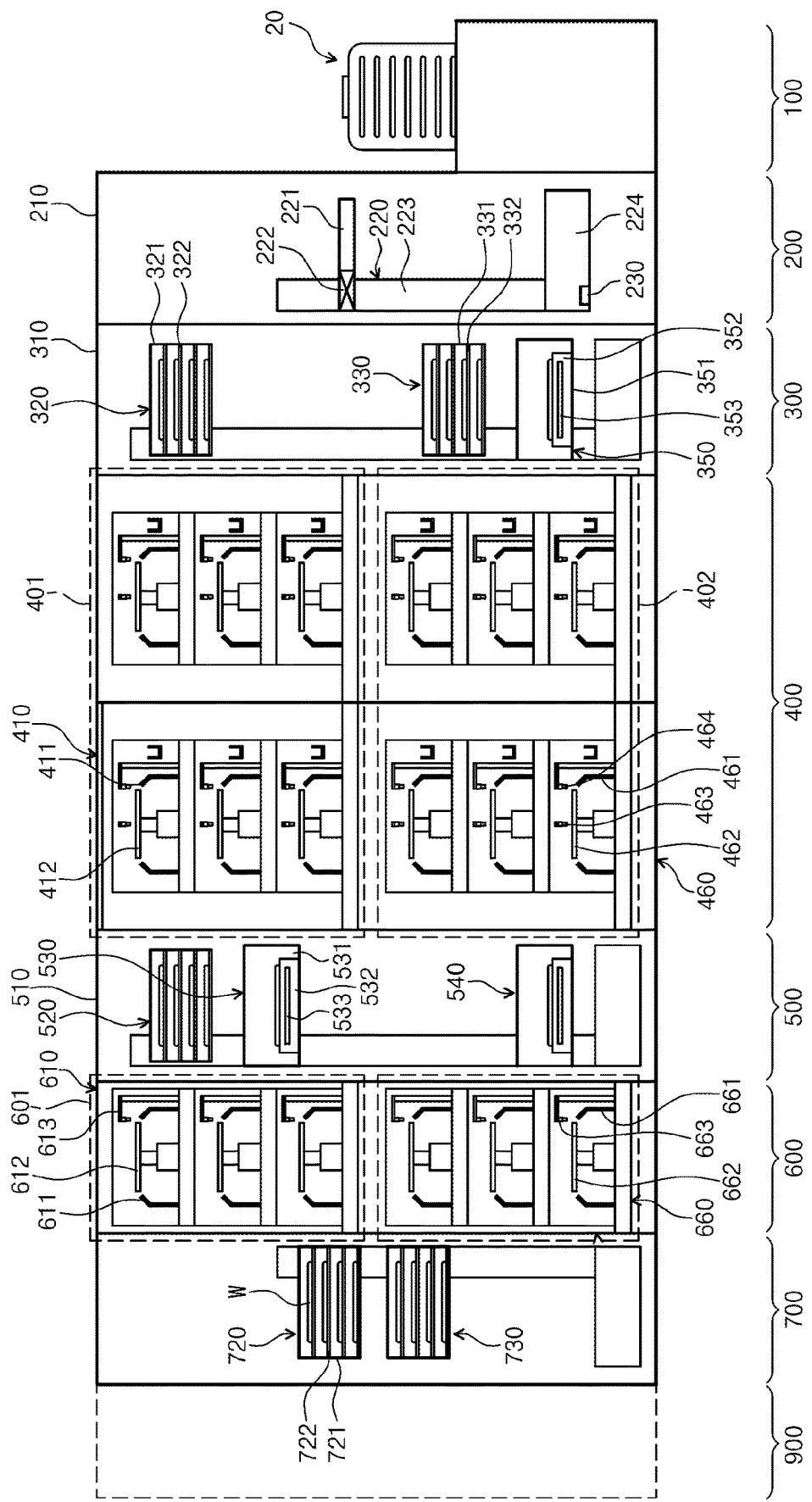
FIG. 2 is a view illustrating the equipment of FIG. 1 when viewed in direction A-A.
Figure 3:
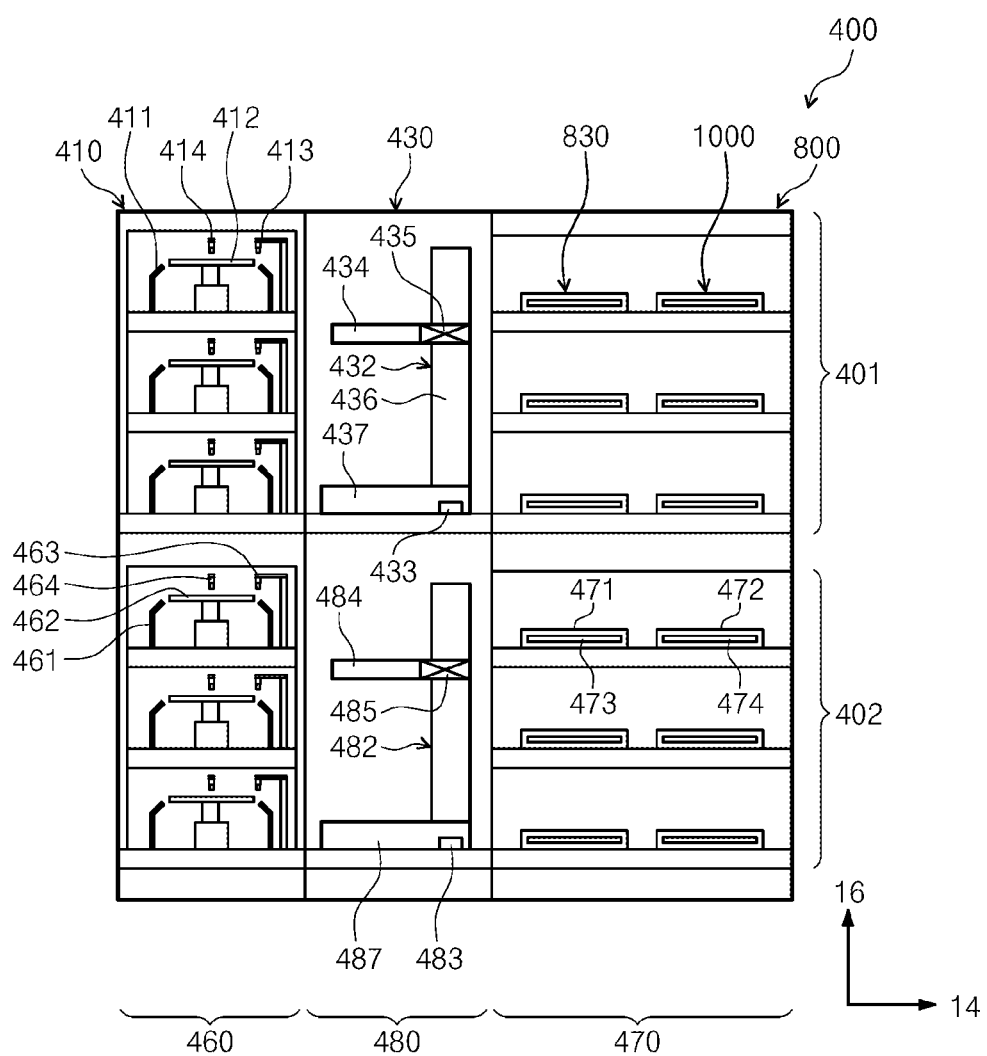
FIG. 3 is a view illustrating the equipment of FIG. 1 when viewed in direction B-B.
Figure 4:
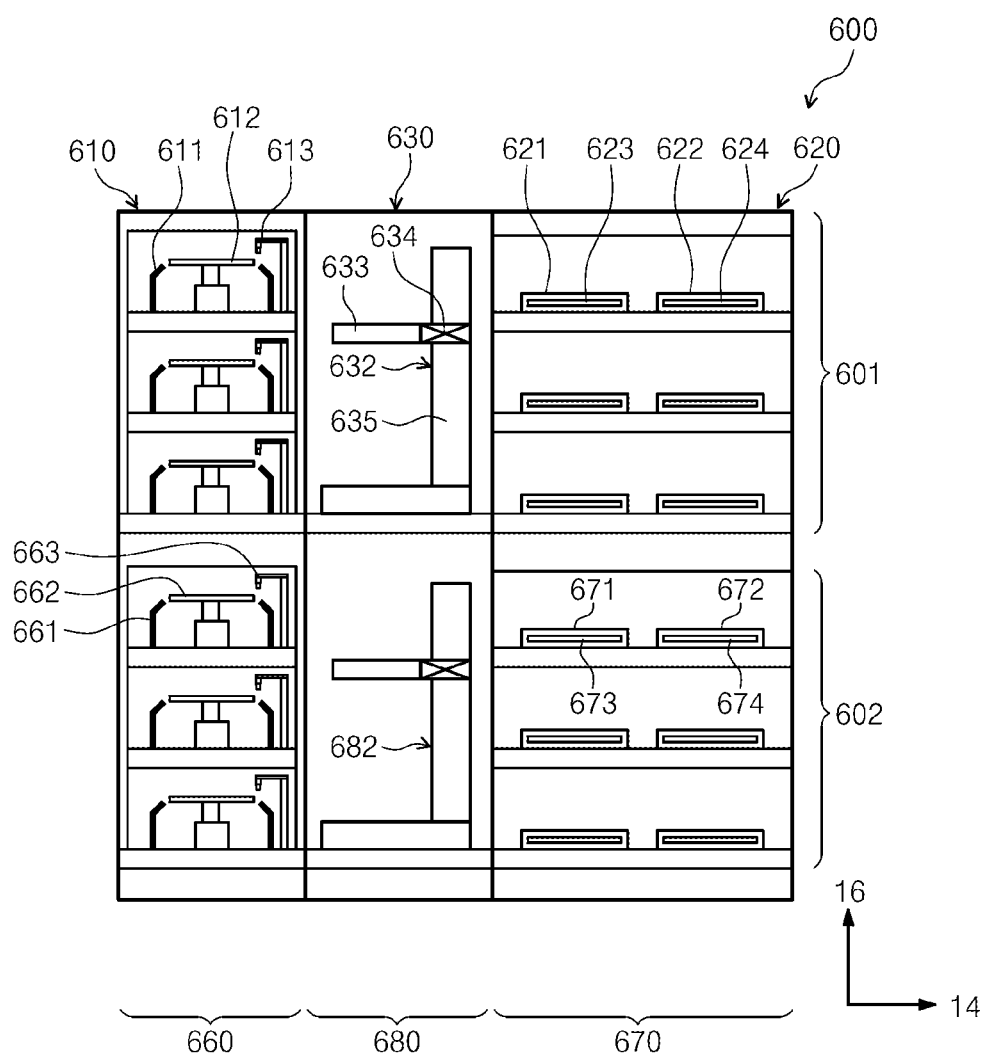
FIG. 4 is a view illustrating the equipment of FIG. 1 when viewed in direction C-C.

FIG. 1 is a schematic plan view illustrating substrate treating equipment according to an embodiment of the inventive concept. FIG. 2 is a view illustrating the equipment of FIG. 1 when viewed in direction A-A. FIG. 3 is a view illustrating the equipment of FIG. 1 when viewed in direction B-B. FIG. 4 is a view illustrating the equipment of FIG. 1 when viewed in direction C-C.

Referring to FIGS. 1 to 4, the substrate treating equipment 1 includes a load port 100, an index module 200, a first buffer module 300, a coating and developing module 400, a second buffer module 500, a pre/post-exposure treatment module 600, and an interface module 700. The load port 100, the index module 200, the first buffer module 300, the coating and developing module 400, the second buffer module 500, the pre/post-exposure treatment module 600, and the interface module 700 are sequentially disposed in a row in one direction.

Hereinafter, a direction in which the load port 100, the index module 200, the first buffer module 300, the coating and developing module 400, the second buffer module 500, the pre/post-exposure treatment module 600, and the interface module 700 are disposed is referred to as a first direction 12. A direction perpendicular to the first direction 12 when viewed from above is referred to as a second direction 14, and a direction perpendicular to the first direction 12 and the second direction 14 is referred to as a third direction 16.

Substrates W are moved in a state of being received in cassettes 20. The cassettes 20 have a structure that can be sealed from the outside. For example, front open unified pods (FOUPs), each of which has a door at the front, may be used as the cassettes 20.

Hereinafter, the load port 100, the index module 200, the first buffer module 300, the coating and developing module 400, the second buffer module 500, the pre/post-exposure treatment module 600, and the interface module 700 will be described in detail.

The load port 100 has a plurality of mounting tables 120 on which the cassettes 20 having the substrates W received therein are placed. The mounting tables 120 are disposed in a row along the second direction 14. In FIG. 2, four mounting tables 120 are provided.

The index module 200 transfers the substrates W between the cassettes 20 placed on the mounting tables 120 of the load port 100 and the first buffer module 300. The index module 200 has a frame 210, an index robot 220, and a guide rail 230. The frame 210 has a substantially rectangular parallelepiped shape with an empty space inside and is disposed between the load port 100 and the first buffer module 300. The frame 210 of the index module 200 may be provided in a lower position than a frame 310 of the first buffer module 300 that will be described below. The index robot 220 and the guide rail 230 are disposed in the frame 210. The index robot 220 has a structure capable of 4-axis driving such that a hand 221 for directly handling the substrates W is movable in the first direction 12, the second direction 14, and the third direction 16 and is rotatable about the central axis thereof.

The index robot 220 has the hand 221, an arm 222, a support rod 223, and a base 224. The hand 221 is fixedly attached to the arm 222. The arm 222 is provided in a retractable and rotatable structure. The support rod 223 is disposed such that the lengthwise direction thereof is parallel to the third direction 16. The arm 222 is coupled to the support rod 223 so as to be movable along the support rod 223. The support rod 223 is fixedly coupled to the base 224. The guide rail 230 is disposed such that the lengthwise direction thereof is parallel to the second direction 14. The base 224 is coupled to the guide rail 230 so as to be rectilinearly movable along the guide rail 230. Furthermore, although not illustrated, a door opener for opening and closing doors of the cassettes 20 is additionally provided in the frame 210.

The first buffer module 300 has the frame 310, a first buffer 320, a second buffer 330, a cooling chamber 350, and a first buffer robot 360. The frame 310 has a rectangular parallelepiped shape with an empty space inside and is disposed between the index module 200 and the coating and developing module 400. The first buffer 320, the second buffer 330, the cooling chamber 350, and the first buffer robot 360 are located in the frame 310. The cooling chamber 350, the second buffer 330, and the first buffer 320 are sequentially disposed upward along the third direction 16. The first buffer 320 is located at the height corresponding to a coating module 401 of the coating and developing module 400 that will be described below, and the second buffer 330 and the cooling chamber 350 are located at the height corresponding to a developing module 402 of the coating and developing module 400 that will be described below. The first buffer robot 360 is located to be spaced apart from the second buffer 330, the cooling chamber 350, and the first buffer 320 by a predetermined distance in the second direction 14.

The first buffer 320 and the second buffer 330 each temporarily store a plurality of substrates W. The second buffer 330 has a housing 331 and a plurality of supports 332. The supports 332 are disposed in the housing 331 and are spaced apart from each other along the third direction 16. One substrate W is placed on each of the supports 332.

The housing 331 has openings (not illustrated) that face the directions in which the index robot 220, the first buffer robot 360, and a developer robot 482 are provided, respectively, such that the index robot 220, the first buffer robot 360, and the developer robot 482 of the developing module 402, which will be described below, load the substrates W onto the supports 332 in the housing 331 or unload the substrates W from the supports 332 in the housing 331. The first buffer 320 has a structure substantially similar to that of the second buffer 330.

However, a housing 321 of the first buffer 320 has openings that face the directions in which the first buffer robot 360 and a coater robot 432 located in the coating module 401 are provided. The number of supports 332 provided in the first buffer 320 may be the same as, or different from, the number of supports 332 provided in the second buffer 330. According to an embodiment, the number of supports 332 provided in the second buffer 330 may be larger than the number of supports 322 provided in the first buffer 320.

The first buffer robot 360 transfers the substrate W between the first buffer 320 and the second buffer 330. The first buffer robot 360 has a hand 361, an arm 362, and a support rod 363. The hand 361 is fixedly attached to the arm 362. The arm 362 has a retractable structure and enables the hand 361 to move along the second direction 14. The arm 362 is coupled to the support rod 363 so as to be rectilinearly movable along the support rod 363 in the third direction 16. The support rod 363 has a length extending from the position corresponding to the second buffer 330 to the position corresponding to the first buffer 320. The support rod 363 may further extend upward or downward. The first buffer robot 360 may be provided such that the hand 361 simply performs only 2-axis driving along the second direction 14 and the third direction 16.

The cooling chamber 350 cools the substrate W. The cooling chamber 350 has a housing 351 and a cooling plate 352. The cooling plate 352 has an upper surface on which the substrate W is placed and a cooling means 353 that cools the substrate W. Various methods, such as cooling by cooling water, cooling by a thermoelectric element, and the like, may be used for the cooling means 353. Furthermore, the cooling chamber 350 may include a lift pin assembly (not illustrated) that locates the substrate W on the cooling plate 352. The housing 351 has openings (not illustrated) that face the directions in which the index robot 220 and the developer robot 482 are provided, respectively, such that the index robot 220 and the developer robot 482 provided in the developing module 402 load the substrate W onto the cooling plate 352 or unload the substrate W from the cooling plate 352. In addition, the cooling chamber 350 may include doors (not illustrated) that open and close the openings described above.

The coating and developing module 400 performs a process of coating the substrate W with photoresist before an exposing process and performs a developing process on the substrate W after the exposing process. The coating and developing module 400 has a substantially rectangular parallelepiped shape. The coating and developing module 400 has the coating module 401 and the developing module 402. The coating module 401 and the developing module 402 are disposed on different floors so as to be divided from each other. According to an embodiment, the coating module 401 is located over the developing module 402.

The coating module 401 performs a process of coating the substrate W with a photosensitive liquid such as photoresist and performs a heat treatment process, such as heating or cooling, on the substrate W before and after the resist coating process. The coating module 401 has resist coating units 410, bake units 800, and a transfer chamber 430. The resist coating units 410, the bake units 800, the transfer chamber 430 are sequentially disposed along the second direction 14. Accordingly, the resist coating units 410 and the bake units 800 are spaced apart from each other in the second direction 14, with the transfer chamber 430 therebetween. The resist coating units 410 are arranged in the first direction 12 and the third direction 16. The drawings illustrate an example that six resist coating units 410 are provided. The bake units 800 are arranged in the first direction 12 and the third direction 16. The drawings illustrate an example that six bake units 800 are provided. However, a larger or smaller number of bake units 800 may be provided.

The transfer chamber 430 is located side by side with the first buffer 320 of the first buffer module 300 in the first direction 12. The coater robot 432 and a guide rail 433 are located in the transfer chamber 430. The transfer chamber 430 has a substantially rectangular shape. The coater robot 432 transfers the substrate W between the bake units 800, the resist coating units 400, the first buffer 320 of the first buffer module 300, and a first cooling chamber 530 of the second buffer module 500 that will be described below.

The guide rail 433 is disposed such that the lengthwise direction thereof is parallel to the first direction 12. The guide rail 433 guides a rectilinear movement of the coater robot 432 in the first direction 12. The coater robot 432 has a hand 434, an arm 435, a support rod 436, and a base 437. The hand 434 is fixedly attached to the arm 435. The arm 435 has a retractable structure and enables the hand 434 to move in the horizontal direction. The support rod 436 is disposed such that the lengthwise direction thereof is parallel to the third direction 16. The arm 435 is coupled to the support rod 436 so as to be rectilinearly movable along the support rod 463 in the third direction 16. The support rod 436 is fixedly coupled to the base 437, and the base 437 is coupled to the guide rail 433 so as to be movable along the guide rail 433.

The resist coating units 410 all have the same structure. However, the types of photosensitive liquids used in the respective resist coating units 410 may differ from one another. For example, chemical amplification resist may be used as a photosensitive liquid. Each of the resist coating units 410 coats the substrate W with a photosensitive liquid. The resist coating unit 410 has a housing 411, a support plate 412, and a nozzle 413. The housing 411 has a cup shape with an open top. The support plate 412 is located in the housing 411 and supports the substrate W. The support plate 412 is provided so as to be rotatable.

The nozzle 413 dispenses the photosensitive liquid onto the substrate W placed on the support plate 412. The nozzle 413 may have a circular tubular shape and may dispense the photosensitive liquid onto the center of the substrate W. Selectively, the nozzle 413 may have a length corresponding to the diameter of the substrate W, and a dispensing opening of the nozzle 413 may have a slit shape. Additionally, the resist coating unit 410 may further include a nozzle 414 that dispenses a cleaning solution, such as deionized water, to clean the surface of the substrate W that is coated with the photosensitive liquid.

Each of the bake units 800 performs heat treatment on the substrate W. The bake unit 800 includes a cooling plate 830 and a heating unit 1000. The cooling plate 830 may cool the substrate W heated by the heating unit 1000. The cooling plate 830 has a circular plate shape. A cooling means, such as cooling water or a thermoelectric element, is provided inside the cooling plate 830. For example, the substrate W placed on the cooling plate 830 may be cooled to a temperature that is the same as, or close to, the room temperature.

The heating unit 1000 is implemented with a substrate treating apparatus that heats the substrate W. The heating unit 1000 heats the substrate W in an atmospheric atmosphere or in an atmosphere of reduced pressure lower than the atmospheric pressure.

Figure 5:
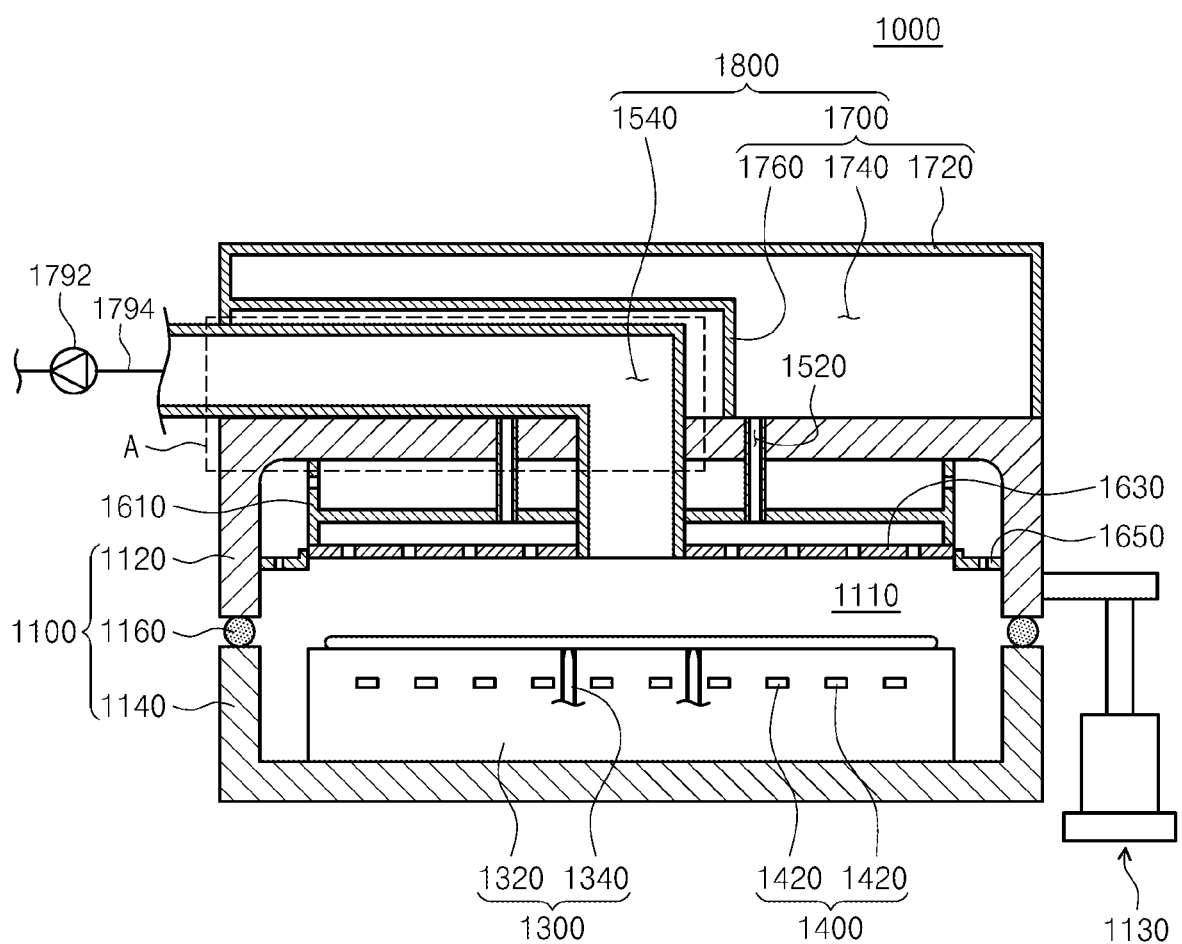
FIG. 5 is a sectional view illustrating a heating unit of FIG. 1.

FIG. 5 is a sectional view illustrating the heating unit of FIG. 1. Referring to FIG. 5, the heating unit 1000 includes a process chamber 1100, a support unit 1300, a heating member 1400, and an exhaust unit 1800.

The process chamber 1100 has a process space 1110 therein in which the substrate W is heated. The process space 1110 is sealed from the outside. The process chamber 1100 includes an upper body 1120, a lower body 1140, and a sealing member 1160.

The upper body 1120 has the shape of a container that is open at the bottom. For example, the upper body 1120 may have a cylindrical shape. The upper body 1120 has an opening formed in an upper wall thereof. The opening may be formed in a region corresponding to the central axis of the upper body 1120.

The lower body 1140 has the shape of a container that is open at the top. For example, the lower body 1140 may have a cylindrical shape. The lower body 1140 is located under the upper body 1120. The upper body 1120 and the lower body 1140 are located to face each other in an up-down direction. The upper body 1120 and the lower body 1140 are combined with each other to form the process space 1110 inside. The upper body 1120 and the lower body 1140 are located such that the central axes thereof are aligned with each other in the up-down direction. The lower body 1140 may have the same diameter as the upper body 1120. That is, an upper end of the lower body 1140 may be located to face a lower end of the upper body 1120.

One of the upper body 1120 and the lower body 1140 is moved to an open position or a closed position by a lifting member 1130, and the other is fixed in position. According to an embodiment, the position of the lower body 1140 may be fixed, and the upper body 1120 may be moved between the open position and the closed position by the lifting member 1130. Here, the open position is a position in which the process space 1110 is open, with the upper body 1120 and the lower body 1140 spaced apart from each other. The closed position is a position in which the process space 1110 is sealed from the outside by the lower body 1140 and the upper body 1120.

The sealing member 1160 fills the gap between the upper body 1120 and the lower body 1140. The sealing member 1160 is located between the lower end of the upper body 1120 and the upper end of the lower body 1140. The sealing member 1160 may be an O-ring member 1160 having an annular ring shape. The sealing member 1160 may be fixedly coupled to the upper end of the lower body 1140.

The support unit 1300 supports the substrate W in the process space 1110. The support unit 1300 is fixedly coupled to the lower body 1140. The support unit 1300 includes a seating plate 1320 and lift pins 1340.

Figure 6:
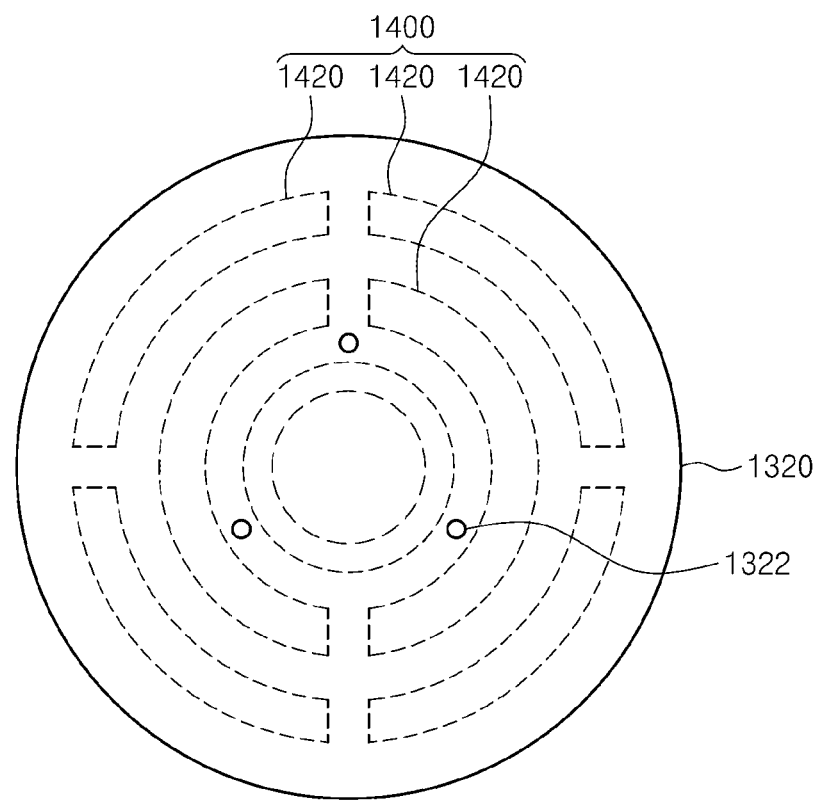
FIG. 6 is a plan view illustrating a heating member and a seating plate of FIG. 5.

FIG. 6 is a plan view illustrating the heating member and the seating plate of FIG. 5. Referring to FIGS. 5 and 6, the seating plate 1320 supports the substrate W in the process space 1110. The seating plate 1320 has a circular plate shape. The substrate W is seated on an upper surface of the seating plate 1320. A central region of the upper surface of the seating plate 1320 functions as a seating surface on which the substrate W is seated. The seating plate 1320 has a plurality of pin holes 1322 formed in the seating surface thereof. When viewed from above, the pin holes 1322 are arranged to surround the center of the seating surface. The pin holes 1322 are arranged to be spaced apart from each other along the circumferential direction. The pin holes 1322 are located to be spaced apart from each other at the same intervals. The lift pins 1340 are located in the pin holes 1322, respectively. The lift pins 1340 are moved in the up-down direction. The lift pins 1340 raise the substrate W off the seating plate 1320, or lay the substrate W down on the seating plate 1320. For example, three pin holes 1322 may be provided.

The heating member 1400 heats the substrate W seated on the seating plate 1320. The heating plate 1400 is located inside the seating plate 1320. The heating member 1400 includes a plurality of heaters 1420. The heaters 1420 are located inside the seating plate 1320. The heaters 1420 are located on the same plane. The heaters 1420 heat different regions of the seating plate 1320. Regions of the seating plate 1320 that correspond to the respective heaters 1420 when viewed from above may be provided as heating zones. The temperatures of the respective heaters 1420 are independently adjustable. For example, 15 heating zones may be provided. The temperature of each of the heating zones is measured by a sensor (not illustrated). The heaters 1420 may be thermoelectric elements or heating wires. Selectively, the heaters 1420 may be mounted on a bottom surface of the seating plate 1320.

Referring again to FIG. 5, the exhaust unit 1800 includes an exhaust duct 1540, a heat retention unit 1700, and a pressure-reducing member 1792. The exhaust duct 1540 releases an atmosphere in the process space 1110. The exhaust duct 1540 is coupled to an upper wall of the process chamber 1100. The heat retention unit 1700 surrounds the exhaust duct 1540 above the process chamber 1100. The heat retention unit 1700 prevents heat loss in a process in which the atmosphere in the process space 1110 heated by the heating member 1400 is released through the exhaust duct 1540. The pressure-reducing member 1792 reduces the pressure in an exhaust line 1794. Exhaust force by the reduction of the pressure is transmitted to the process space 1110 to release outside air.

The heat retention unit 1700 includes a housing 1720 that is formed of a heat insulating material and that has a retention space 1740 therein. The retention space 1740 surrounds an adjacent area A between the exhaust duct 1540 and the process chamber 1100. The adjacent area A is an area to which the upper wall of the process chamber 1100 and the exhaust duct 1540 are adjacent. In the adjacent area A, heat loss occurs through the upper wall of the process chamber 1100 and the outermost portion of the exhaust duct 1540.

Figure 7:
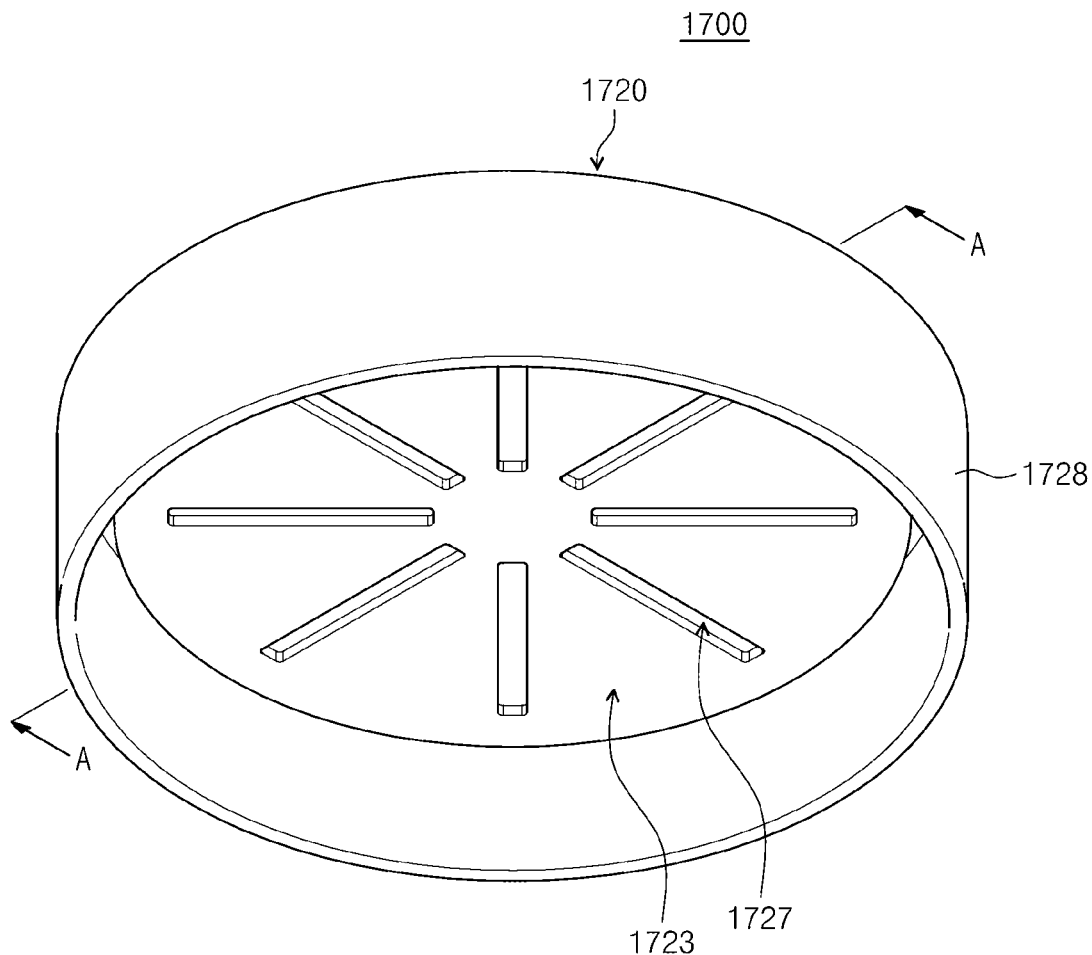
FIG. 7 is a perspective view illustrating a housing according to an embodiment of the inventive concept.
Figure 8:
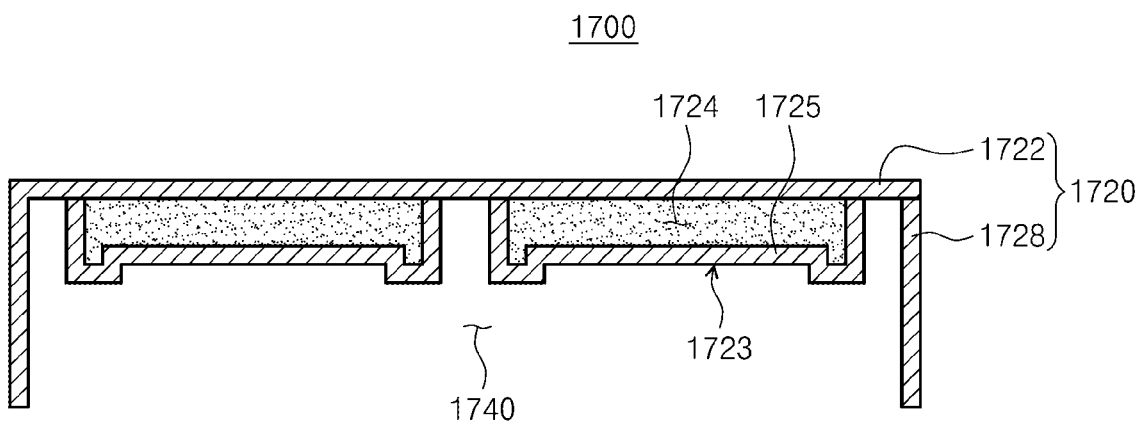
FIG. 8 is a sectional view taken along line A-A of FIG. 7.
Figure 9:
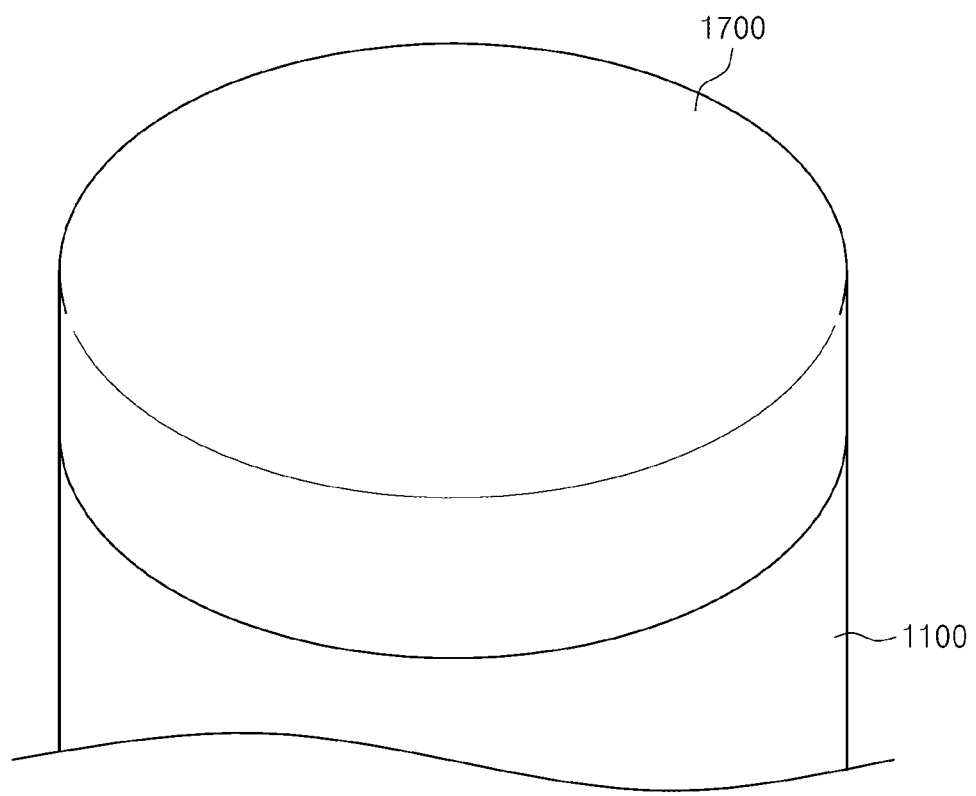
FIG. 9 is a view illustrating a state in which the housing is coupled to a process chamber according to an embodiment of the inventive concept.

FIGS. 7 and 9 are perspective views illustrating the housing 1720 according to an embodiment of the inventive concept, and FIG. 8 is a sectional view taken along line A-A of FIG. 7. Referring to FIGS. 7 to 9, the housing 1720 includes an upper wall 1722 and a ring-shaped sidewall 1728 extending downward from the upper wall 1722. The sidewall 1728 is directly coupled to the process chamber 1100. The housing 1720 is attached to the upper wall of the process chamber 1100.

The housing 1720 has the retention space 1740 formed between the exhaust duct 1540 and the housing 1720. The retention space 1740 retains heat released or transferred from the exhaust duct 1540. The retention space 1740 may contain a heat insulating material.

The housing 1720 may further include a shape-retaining member 1723 that maintains the shape of the upper wall 1722. The shape-retaining member 1723 prevents the upper wall 1722 from sagging or collapsing. The shape-retaining member 1723 may include a reinforcing plate 1725 coupled to a bottom surface of the upper wall 1722 to form an interior space 1724 between the upper wall 1722 and the shape-retaining member 1723.

In an embodiment, radially extending grooves 1727 may be formed on a bottom surface of the reinforcing plate 1725. The grooves 1727 formed on the bottom surface of the reinforcing plate 1725 prevent the reinforcing plate 1725 from sagging or collapsing. According to an embodiment, the grooves 1727 may be formed through forming of the reinforcing plate 1725.

The interior space 1724 is filled with gas. The interior space 1724 is sealed such that a flow of the gas to the outside is interrupted. The gas does not flow in the interior space 174, and therefore heat transfer between the retention space 1740 and the outside of the housing 1720 is interrupted. According to an embodiment, the gas is air.

When viewed from above, the housing 1720 may have a size corresponding to that of the process chamber 1100. The bottom of the housing 1720 is provided to correspond to the upper wall of the process chamber 1100. Accordingly, heat loss through the upper wall of the process chamber 1100 is effectively prevented.

Figure 10:
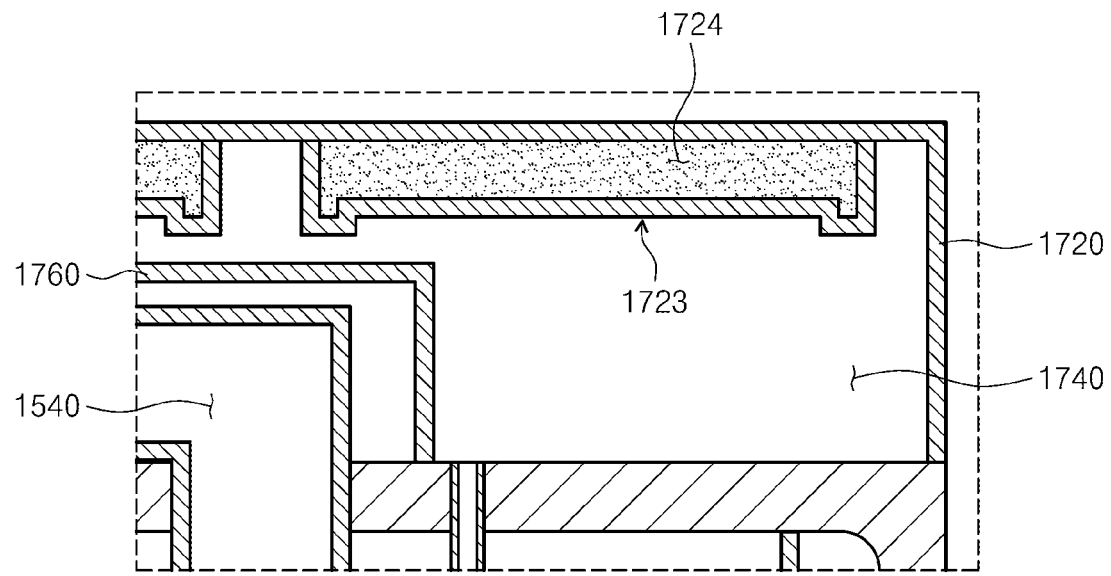
FIG. 10 is a view illustrating the housing and a cover according to an embodiment of the inventive concept.

Referring to FIG. 10, the heat retention unit 1700 may further include a cover 1760 that surrounds the exhaust duct 1540 in the adjacent area A. In the adjacent area A, the exhaust duct 1540 conserves heat of the exhaust duct 1540 and the upper wall of the process chamber 1100 by the cover 1760 and the housing 1720.

The cover 1760 may be formed of a heat insulating material. The heat of the exhaust duct 1540 is first conserved by the cover 1760. According to an embodiment, the cover 1760 may surround the exhaust duct 1540 without sealing the same. Even through the cover 1760 surrounds the exhaust duct 1540, heat loss may still occur through the cover 1760 and the process chamber 1100.

The cover 1760 firstly insulates heat lost from the exhaust duct 1540. Furthermore, the interior space 1724 interrupts heat transfer between the outside of the housing 1720 and the retention space 1740, and the housing 1720 conserves the heat of the exhaust duct 1540 and the upper wall of the process chamber 1100. Thus, heat loss from the exhaust duct 1540 is prevented once again.

In the above-described embodiments, it has been described that the retention space 1740 retains only the heat released from the exhaust duct 1540. However, the housing 1720 may form a sealed space above the process chamber 1100, and likewise to the interior space 1724, the retention space 1740 may retain gas.

Figure 11:
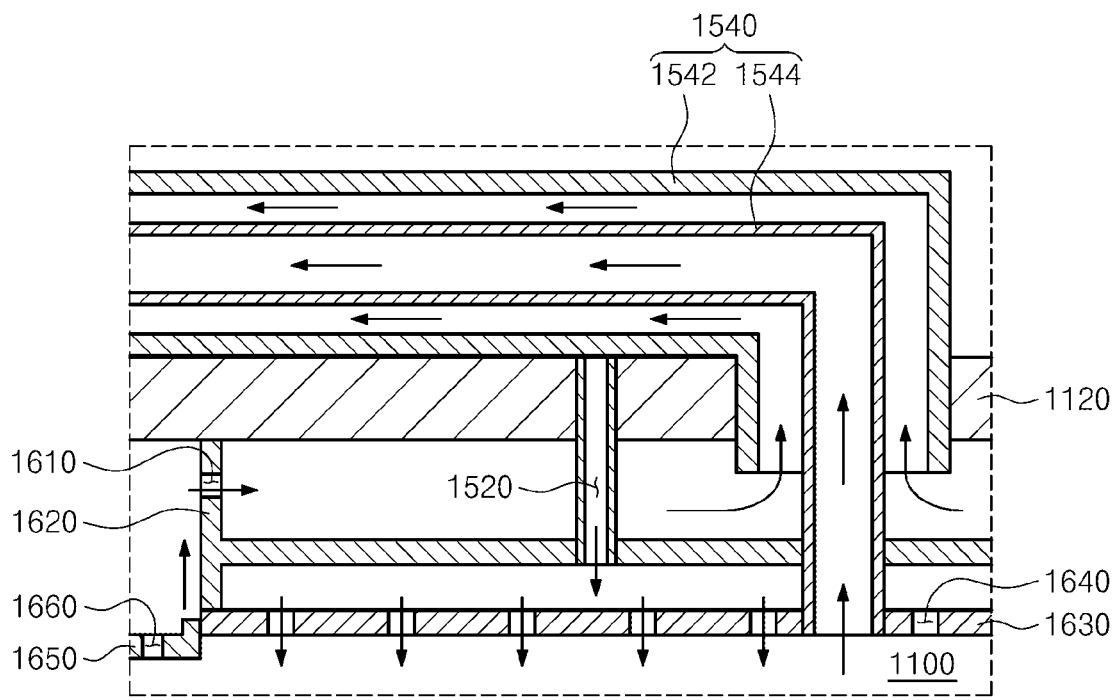
FIG. 11 is a view illustrating an exhaust unit according to another embodiment of the inventive concept.

In the above-described embodiments, the exhaust duct 1540 has been described as a single duct. However, according to another embodiment, as illustrated in FIG. 11, the exhaust duct 1540 may be implemented with two or more ducts.

A gas plate 1630 and a shielding plate 1620 may be disposed in the process space 1110. The gas plate 1630 and the shielding plate 1620 are provided such that an area of the process space 1110 that faces a central region of the substrate W and an area of the process space 1110 that faces an edge region of the substrate W are separately evacuated.

The gas plate 1630 is disposed in the process space 1110 to face the substrate W supported on the support unit 1300. The shielding plate 1620 is disposed on the top side of the gas plate 1630.

The gas plate 1630 has holes 1640 formed therein. Outside air introduced from an inflow hole 1520 may be introduced into the process space 1110 through the holes 1640. The outside air introduced through the holes 1640 generates a downward air flow in the process space 1110. A first duct 1544 is coupled to the gas plate 1630.

A surface of the shielding plate 1620 that faces the gas plate 1630 is blocked, and holes 1610 are formed in a surface of the shielding plate 1620 that faces the edge region of the substrate W. A second duct 1542 is coupled to the shielding plate 1620. The atmosphere over the edge region of the substrate W may be released through holes 1660 formed in an edge plate 1650, which is coupled to the gas plate 1630, and the second duct 1542.

Figure 12:
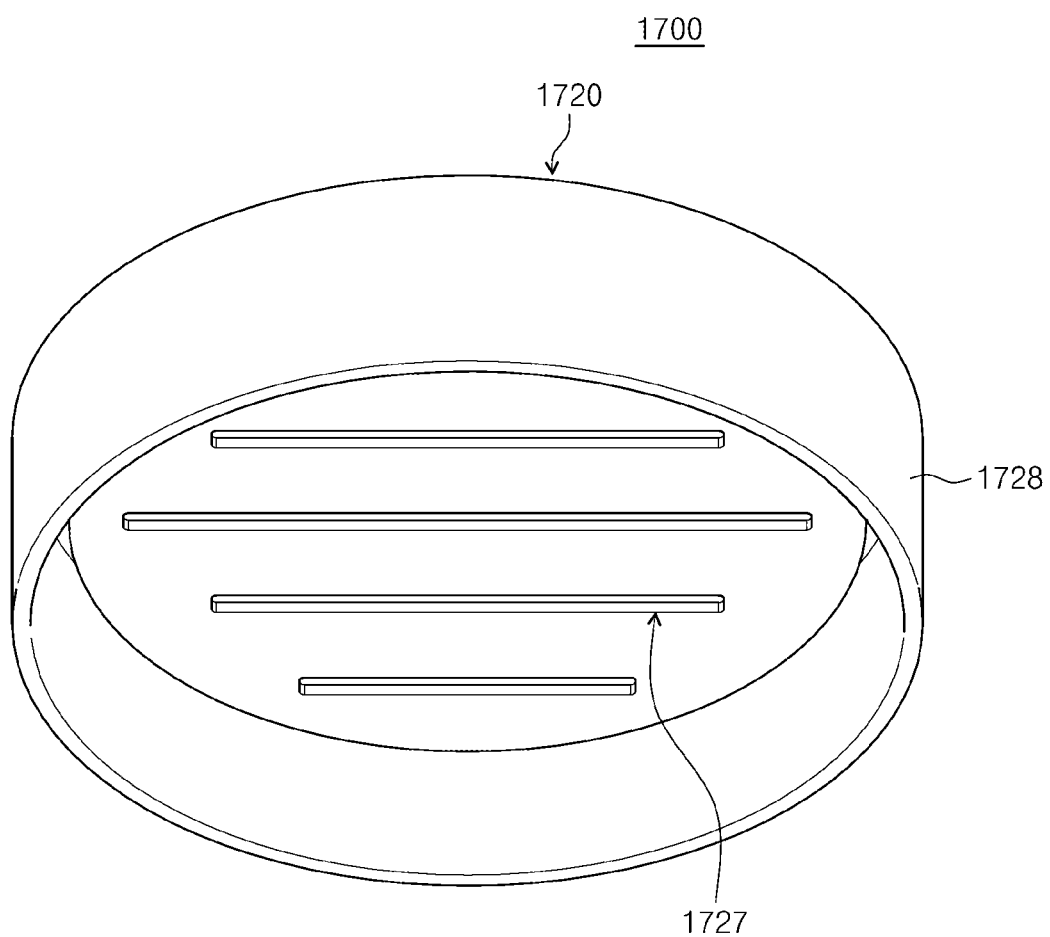
FIG. 12 is a view illustrating a housing according to another embodiment of the inventive concept.

In the above-described embodiments, it has been described that the grooves 1727 are radially formed on the reinforcing plate 1725. However, according to another embodiment, as illustrated in FIG. 12, the grooves 1727 may be formed in the shape of a straight line.

As described above, the inventive concept interrupts a movement of air between the exhaust duct 1540 and the housing 1720, thereby preventing heat transfer by the movement of air. Accordingly, the inventive concept has an advantage of decreasing heat loss through the exhaust duct 1540 and the process chamber 1100.

Furthermore, the inventive concept has an advantage of decreasing heat loss of the exhaust duct 1540 without significantly increasing the weight of the substrate treating apparatus by insulating the exhaust duct 1540 and the upper wall of the process chamber 1100 using air having a low density rather than a solid material on the exterior of the cover 1760.

Moreover, the inventive concept has an advantage of preventing fumes from being deposited on the inside of the exhaust duct 1540, by decreasing heat loss of the exhaust duct 1540.

In addition, according to the inventive concept, the grooves 1727 for preventing deformation of the shape-retaining member 1723 are formed on the shape-retaining member 1723 through forming. Accordingly, the inventive concept has an advantage of preventing sagging of the housing 1720 without a separate reinforcing member.

Referring again to FIGS. 1 to 4, the developing module 402 performs a developing process of removing part of photoresist by supplying a developing solution to obtain patterns on the substrate W and a heat treatment process of heating and cooling the substrate W before or after the developing process. The developing module 402 has developing units 460, bake units 470, and a transfer chamber 480. The developing units 460, the bake units 470, and the transfer chamber 480 are sequentially disposed along the second direction 14. Accordingly, the developing units 460 and the bake units 470 are spaced apart from each other in the second direction 14, with the transfer chamber 480 therebetween. The developing units 460 are arranged in the first direction 12 and the third direction 16. The drawings illustrate an example that six developing units 460 are provided. The bake units 470 are arranged in the first direction 12 and the third direction 16. The drawings illustrate an example that six bake units 470 are provided. However, a larger number of bake units 470 may be provided.

The transfer chamber 480 is located side by side with the second buffer 330 of the first buffer module 300 in the first direction 12. The developer robot 482 and a guide rail 483 are located in the transfer chamber 480. The transfer chamber 480 has a substantially rectangular shape. The developer robot 482 transfers the substrate W between the bake units 470, the developing units 460, the second buffer 330 and the cooling chamber 350 of the first buffer module 300, and a second cooling chamber 540 of the second buffer module 500. The guide rail 483 is disposed such that the lengthwise direction thereof is parallel to the first direction 12. The guide rail 483 guides a rectilinear movement of the developer robot 482 in the first direction 12. The developer robot 482 has a hand 484, an arm 485, a support rod 486, and a base 487. The hand 484 is fixedly attached to the arm 485. The arm 485 has a retractable structure and enables the hand 484 to move in the horizontal direction. The support rod 486 is disposed such that the lengthwise direction thereof is parallel to the third direction 16. The arm 485 is coupled to the support rod 486 so as to be rectilinearly movable along the support rod 463 in the third direction 16. The support rod 486 is fixedly coupled to the base 487. The base 487 is coupled to the guide rail 483 so as to be movable along the guide rail 483.

The developing units 460 all have the same structure. However, the types of developing solutions used in the respective developing units 460 may differ from one another. Each of the developing units 460 removes light-exposed regions of the photoresist on the substrate W. At this time, light-exposed regions of a protective film are also removed. Selectively, depending on the type of photoresist used, only masked regions of the photoresist and the protective film may be removed.

The developing unit 460 has a housing 461, a support plate 462, and a nozzle 463. The housing 461 has a cup shape with an open top. The support plate 462 is located in the housing 461 and supports the substrate W. The support plate 462 is provided so as to be rotatable. The nozzle 463 dispenses a developing solution onto the substrate W placed on the support plate 462. The nozzle 463 may have a circular tubular shape and may dispense the developing solution onto the center of the substrate W. Selectively, the nozzle 463 may have a length corresponding to the diameter of the substrate W, and a dispensing opening of the nozzle 463 may have a slit shape. Additionally, the developing unit 460 may further include a nozzle 464 that dispenses a cleaning solution such as deionized water to clean the surface of the substrate W onto which the developing solution is dispensed.

The bake units 470 of the developing module 402 perform heat treatment on the substrate W. For example, the bake units 470 perform a post bake process of heating the substrate W before the developing process, a hard bake process of heating the substrate W after the developing process, and a cooling process of cooling the substrate W after the bake processes. Each of the bake units 470 has a cooling plate 471 or a heating unit 472. A cooling means 473, such as cooling water or a thermoelectric element, is provided inside the cooling plate 471. Alternatively, a heating means 474, such as a heating wire or a thermoelectric element, is provided inside the heating unit 472. The cooling plate 471 and the heating unit 472 may be provided in one bake unit 470. Selectively, some of the bake units 470 may include only the cooling plate 471, and the other bake units 470 may include only the heating unit 472. The bake units 470 of the developing module 402 have the same configuration as the bake units 800 of the coating module 401, and therefore detailed description thereabout will be omitted.

The second buffer module 500 serves as a passage through which the substrate W is carried between the coating and developing module 400 and the pre/post-exposure treatment module 600. In addition, the second buffer module 500 performs a predetermined process, such as a cooling process or an edge exposing process, on the substrate W. The second buffer module 500 has a frame 510, a buffer 520, a first cooling chamber 530, a second cooling chamber 540, an edge exposing chamber 550, and a second buffer robot 560. The chamber 510 has a rectangular parallelepiped shape. The buffer 520, the first cooling chamber 530, the second cooling chamber 540, the edge exposing chamber 550, and the second buffer robot 560 are located in the frame 510. The buffer 520, the first cooling chamber 530, and the edge exposing chamber 550 are disposed at the height corresponding to the coating module 401. The second cooling chamber 540 is disposed at the height corresponding to the developing module 402. The buffer 520, the first cooling chamber 530, and the second cooling chamber 540 are sequentially disposed in a row along the third direction 16. When viewed from above, the buffer 520 is disposed side by side with the transfer chamber 430 of the coating module 401 along the first direction 12. The edge exposing chamber 550 is disposed to be spaced apart from the buffer 520 or the first cooling chamber 530 by a predetermined distance in the second direction 14.

The second buffer robot 560 carries the substrate W between the buffer 520, the first cooling chamber 530, and the edge exposing chamber 550. The second buffer robot 560 is located between the edge exposing chamber 550 and the buffer 520. The second buffer robot 560 may have a structure similar to that of the first buffer robot 360. The first cooling chamber 530 and the edge exposing chamber 550 perform subsequent processes on the substrate W treated in the coating module 401. The first cooling chamber 530 cools the substrate W treated in the coating module 401. The first cooling chamber 530 has a structure similar to that of the cooling chamber 350 of the first buffer module 300. The edge exposing chamber 550 performs an edge exposing process on the substrate W subjected to the cooling process in the first cooling chamber 530. The buffer 520 temporarily stores the substrate W before the substrate W treated in the edge exposing chamber 550 is transferred to a pre-treatment module 601 that will be described below. The second cooling chamber 540 cools the substrate W before the substrate W treated in a post-treatment module 602, which will be described below, is transferred to the developing module 402. The second buffer module 500 may further include an additional buffer at the height corresponding to the developing module 402. In this case, the substrate W treated in the post-treatment module 602 may be transferred to the developing module 402 after temporarily stored in the additional buffer.

In a case where a stepper 900 performs a liquid immersion lithography process, the pre/post-exposure treatment module 600 may perform a process of coating the substrate W with a protective film that protects the photoresist film on the substrate W during the liquid immersion lithography process. Furthermore, the pre/post-exposure treatment module 600 may perform a process of cleaning the substrate W after an exposing process. In addition, in a case where a coating process is performed using chemical amplification resist, the pre/post-exposure treatment module 600 may perform a post-exposure bake process.

The pre/post-exposure treatment module 600 has the pre-treatment module 601 and the post-treatment module 602. The pre-treatment module 601 performs a process of treating the substrate W before the exposing process, and the post-treatment module 602 performs a process of treating the substrate W after the exposing process. The pre-treatment module 601 and the post-treatment module 602 are disposed on different floors so as to be divided from each other. According to an embodiment, the pre-treatment module 601 is located over the post-treatment module 602. The pre-treatment module 601 is located at the same height as the coating module 401. The post-treatment module 602 is located at the same height as the developing module 402. The pre-treatment module 601 has protective-film coating units 610, bake units 620, and a transfer chamber 630. The protective-film coating units 610, the transfer chamber 630, and the bake units 620 are sequentially disposed along the second direction 14. Accordingly, the protective-film coating units 610 and the bake units 620 are spaced apart from each other in the second direction 14, with the transfer chamber 630 therebetween. The protective-film coating units 610 are vertically arranged along the third direction 16. Selectively, the protective-film coating units 610 may be arranged in the first direction 12 and the third direction 16. The bake units 620 are vertically arranged along the third direction 16. Selectively, the bake units 620 may be arranged in the first direction 12 and the third direction 16.

The transfer chamber 630 is located side by side with the first cooling chamber 530 of the second buffer module 500 in the first direction 12. A pre-treatment robot 632 is located in the transfer chamber 630. The transfer chamber 630 has a substantially square or rectangular shape. The pre-treatment robot 632 transfers the substrate W between the protective-film coating units 610, the bake units 620, the buffer 520 of the second buffer module 500, and a first buffer 720 of the interface module 700 that will be described below. The pre-treatment robot 632 has a hand 633, an arm 634, and a support rod 635. The hand 633 is fixedly attached to the arm 634. The arm 634 is provided in a retractable and rotatable structure. The arm 634 is coupled to the support rod 635 so as to be rectilinearly movable along the support rod 635 in the third direction 16.

Each of the protective-film coating units 610 coats the substrate W with a protective film that protects a resist film during liquid immersion lithography. The protective-film coating unit 610 has a housing 611, a support plate 612, and a nozzle 613. The housing 611 has a cup shape with an open top. The support plate 612 is located in the housing 611 and supports the substrate W. The support plate 612 is provided so as to be rotatable. The nozzle 613 dispenses a protective liquid for forming a protective film onto the substrate W placed on the support plate 612. The nozzle 613 may have a circular tubular shape and may dispense the protective liquid onto the center of the substrate W. Selectively, the nozzle 613 may have a length corresponding to the diameter of the substrate W, and a dispensing opening of the nozzle 613 may have a slit shape. In this case, the support plate 612 may be provided in a fixed state. The protective liquid contains a foam material. A material having a low affinity with photoresist and water may be used as the protective liquid. For example, the protective liquid may include a fluorine-based solvent. The protective-film coating unit 610 dispenses the protective liquid onto the central region of the substrate W while rotating the substrate W placed on the support plate 612.

Each of the bake units 620 performs heat treatment on the substrate W coated with the protective film. The bake unit 620 has a cooling plate 621 or a heating plate 622. A cooling means 623, such as cooling water or a thermoelectric element, is provided inside the cooling plate 621. Alternatively, a heating means 624, such as a heating wire or a thermoelectric element, is provided inside the heating plate 622. The heating plate 622 and the cooling plate 621 may be provided in one bake unit 620. Selectively, some of the bake units 620 may include only the heating plate 622, and the other bake units 620 may include only the cooling plate 621.

The post-treatment module 602 has cleaning chambers 660, post-exposure bake units 670, and a transfer chamber 680. The cleaning chambers 660, the transfer chamber 680, and the post-exposure bake units 670 are sequentially disposed along the second direction 14. Accordingly, the cleaning chambers 660 and the post-exposure bake units 670 are spaced apart from each other in the second direction 14, with the transfer chamber 680 therebetween. The cleaning chambers 660 may be vertically arranged along the third direction 16. Selectively, the cleaning chambers 660 may be arranged in the first direction 12 and the third direction 16. The post-exposure bake units 670 may be vertically arranged along the third direction 16. Selectively, the post-exposure bake units 670 may be arranged in the first direction 12 and the third direction 16.

The transfer chamber 680, when viewed from above, is located side by side with the second cooling chamber 540 of the second buffer module 500 in the first direction 12. The transfer chamber 680 has a substantially square or rectangular shape. A post-treatment robot 682 is located in the transfer chamber 680. The post-treatment robot 682 transfers the substrate W between the cleaning chambers 660, the post-exposure bake units 670, the second cooling chamber 540 of the second buffer module 500, and a second buffer 730 of the interface module 700 that will be described below. The post-treatment robot 682 provided in the post-treatment module 602 may have the same structure as the pre-treatment robot 632 provided in the pre-treatment module 601.

Each of the cleaning chambers 660 performs a cleaning process on the substrate W after the exposing process. The cleaning chamber 660 has a housing 661, a support plate 662, and a nozzle 663. The housing 661 has a cup shape with an open top. The support plate 662 is located in the housing 661 and supports the substrate W. The support plate 662 is provided so as to be rotatable. The nozzle 663 dispenses a cleaning solution onto the substrate W placed on the support plate 662. Water such as deionized water may be used as the cleaning solution. The cleaning chamber 660 dispenses the cleaning solution onto the central region of the substrate W while rotating the substrate W placed on the support plate 662. Selectively, while the substrate W is rotated, the nozzle 663 may rectilinearly move or swing from the central region of the substrate W to the edge region thereof.

Each of the post-exposure bake units 670 heats the substrate W, which is subjected to the exposing process, by using far ultraviolet rays. A post-exposure bake process heats the substrate W to amplify acid generated in the photoresist by the exposing process, thereby completing a change in the property of the photoresist. The post-exposure bake unit 670 has a heating plate 672. A heating means 674, such as a heating wire or a thermoelectric element, is provided inside the heating plate 672. The post-exposure bake unit 670 may further include a cooling plate 671 therein. A cooling means 673, such as cooling water or a thermoelectric element, is provided inside the cooling plate 671. Selectively, a bake unit having only the cooling plate 671 may be additionally provided.

As described above, the pre-treatment module 601 and the post-treatment module 602 are completely separated from each other in the pre/post-exposure treatment module 600. Furthermore, the transfer chamber 630 of the pre-treatment module 601 and the transfer chamber 680 of the post-treatment module 602 may have the same size and may completely cover each other when viewed from above. Moreover, the protective-film coating unit 610 and the cleaning chamber 660 may have the same size and may completely cover each other when viewed from above. In addition, the bake unit 620 and the post-exposure bake unit 670 may have the same size and may completely cover each other when viewed from above.

The interface module 700 transfers the substrate W between the pre/post-exposure treatment module 600 and the stepper 900. The interface module 700 has a frame 710, the first buffer 720, the second buffer 730, and an interface robot 740. The first buffer 720, the second buffer 730, and the interface robot 740 are located in the frame 710. The first buffer 720 and the second buffer 730 are vertically spaced apart from each other by a predetermined distance. The first buffer 720 is disposed in a higher position than the second buffer 730. The first buffer 720 is located at the height corresponding to the pre-treatment module 601, and the second buffer 730 is disposed at the height corresponding to the post-treatment module 602. When viewed from above, the first buffer 720 is disposed in a row along the first direction 12 together with the transfer chamber 630 of the pre-treatment module 601, and the second buffer 730 is disposed in a row along the first direction 12 together with the transfer chamber 680 of the post-treatment module 602.

The interface robot 740 is located to be spaced apart from the first buffer 720 and the second buffer 730 in the second direction 14. The interface robot 740 transfers the substrate W between the first buffer 720, the second buffer 730, and the stepper 900. The interface robot 740 has a structure substantially similar to that of the second buffer robot 560.

The first buffer 720 temporarily stores the substrate W before the substrate W treated in the pre-treatment module 601 is moved to the stepper 900. The second buffer 730 temporarily stores the substrate W before the substrate W treated in the stepper 900 is moved to the post-treatment module 602. The first buffer 720 has a housing 721 and a plurality of supports 722. The supports 722 are disposed in the housing 721 and are spaced apart from each other along the third direction 16. One substrate W is placed on each of the supports 722. The housing 721 has openings (not illustrated) that face the directions in which the interface robot 740 and the pre-treatment robot 632 are provided, respectively, such that the interface robot 740 and the pre-treatment robot 632 load the substrates W onto the supports 722 in the housing 721 or unload the substrates W from the supports 722 in the housing 721. The second buffer 730 has a structure substantially similar to that of the first buffer 720. However, the housing of the second buffer 730 has no opening in the direction in which the interface robot 740 and the post-treatment robot 682 are provided. The interface module 700 may include only the buffers and the robot as described above, without including a chamber for performing a predetermined process on a substrate.

As described above, according to the embodiments of the inventive concept, the exhaust duct may be maintained at high temperature.

In addition, according to the embodiments of the inventive concept, fumes may be prevented from being deposited on the exhaust duct.

Effects of the inventive concept are not limited to the above-described effects, and any other effects not mentioned herein may be clearly understood from this specification and the accompanying drawings by those skilled in the art to which the inventive concept pertains.

While the inventive concept has been described with reference to exemplary embodiments, it will be apparent to those skilled in the art that various changes and modifications may be made without departing from the spirit and scope of the inventive concept. Therefore, it should be understood that the above embodiments are not limiting, but illustrative.

What is claimed is:

1. An apparatus for treating a substrate, the apparatus comprising:
   a process chamber having a process space therein;
   a support plate configured to support the substrate in the process space;
   a heater configured to heat the substrate supported on the support plate;
   an exhaust unit configured to evacuate the process space, wherein the exhaust unit includes:
      an exhaust duct; and
      a heat retainer having a retention space configured to retain heat released from the process space,
   wherein the retention space surrounds an adjacent area located adjacent to the process chamber in the exhaust duct,
   wherein the exhaust duct has a portion parallel with respect to an upper side of the process chamber,
   wherein the portion is contacted with the upper side of the process chamber,
   wherein the heat retainer includes a housing having the retention space therein,
   wherein the heat retainer further includes a shape retainer configured to maintain a shape of an upper wall of the housing,
   wherein the shape retainer includes a reinforcing plate coupled to a bottom surface of the upper wall to form an interior space enclosed by the upper wall and the shape retainer,
   wherein the interior space is filled with a gas, and
   wherein the interior space is provided in a state in which a flow of the gas to an outside of the interior space is completely blocked.

2. The apparatus of claim 1, wherein the housing includes a heat insulating material.

3. The apparatus of claim 2, wherein the exhaust duct is coupled to an upper wall of the process chamber,
  wherein the housing is attached to the upper wall of the process chamber, and
  wherein the adjacent area is an area to which the upper wall of the process chamber and the exhaust duct are adjacent.

4. The apparatus of claim 2, wherein the housing includes:
a ring-shaped sidewall extending downward from the upper wall, and
wherein the sidewall is directly coupled to the process chamber.

5. The apparatus of claim 2, wherein when viewed from above, the housing has a size corresponding to the process chamber.

6. The apparatus of claim 1, wherein the reinforcing plate has radially extending grooves formed on a bottom surface thereof.

7. The apparatus of claim 1, wherein the gas is air.

8. The apparatus of claim 1, wherein the heat retainer further includes a cover configured to surround the exhaust duct in the adjacent area.

9. The apparatus of claim 1, wherein the apparatus further comprises:
  a gas plate disposed in the process space to face the substrate supported on the support plate; and
  a shielding plate disposed on a top side of the gas plate, and
  wherein the exhaust duct includes:
    a first duct coupled to the gas plate; and
    a second duct coupled to the shielding plate.

10. The apparatus of claim 9, wherein the gas plate has holes through which gas is supplied to generate a downward gas flow in the process space.

11. The apparatus of claim 1, wherein a treatment of the substrate is a bake process.

\* \* \* \* \*